United States Patent [19]

Weng

[11] Patent Number: 5,321,703
[45] Date of Patent: Jun. 14, 1994

[54] DATA RECOVERY AFTER ERROR CORRECTION FAILURE

[75] Inventor: Lih-Jyh Weng, Shrewsbury, Mass.

[73] Assignee: Digital Equipment Corporation, Maynard, Mass.

[21] Appl. No.: 850,718

[22] Filed: Mar. 13, 1992

[51] Int. Cl.$^5$ .............................. H04L 1/08
[52] U.S. Cl. ............................. 371/36; 371/38.1
[58] Field of Search ............ 371/36, 20.1, 32, 33, 371/38.1, 44

[56] References Cited

U.S. PATENT DOCUMENTS

| | | | |
|---|---|---|---|
| 3,164,804 | 1/1965 | Burton et al. | 340/146.1 |
| 3,639,901 | 2/1972 | Mitchell | 340/146.1 |
| 4,132,975 | 1/1979 | Koike | 340/146.1 B A |
| 4,670,880 | 6/1987 | Jitsukawa et al. | 371/36 |
| 4,672,612 | 6/1987 | Shishikura et al. | 371/37 |
| 4,733,396 | 3/1988 | Baldwin, et al. | 371/38 |
| 4,937,843 | 6/1990 | Takemoto | 375/116 |
| 5,241,548 | 5/1991 | Dillon et al. | 371/36 |

FOREIGN PATENT DOCUMENTS

| | | |
|---|---|---|
| 0174040 | 3/1986 | European Pat. Off. . |
| 0177690 | 4/1986 | European Pat. Off. . |

OTHER PUBLICATIONS

"Error Correction of Digital Image Data", Database WPI, Section EI, Week 8929, Jun. 10, 1989, Derwent Publications Ltd., London, GB; AN 89-212248.
Patent Abstracts of Japan, vol. 15, No. 102 (E-1043) Mar. 12, 1991 & JP,A,23 09 821 (Fujitsu Limited)25.

*Primary Examiner*—Vincent P. Canney
*Attorney, Agent, or Firm*—Albert P. Cefalo; Ronald C. Hudgens; James F. Thompson

[57] ABSTRACT

A method of data recovery in systems employing error-correction coding techniques is described. The technique may be used, for example, in conjunction with a data storage device or a data communications network. Several trials of accessing or transmitting the ECC-protected data are performed. The data from each trial is decoded, and is also saved. If none of the trials results in the successful decoding of the data, then a reconstruction function is employed to create a reconstructed version of the data from the sequence of data created by the trials. One method of reconstruction involves majority voting on a symbol-by-symbol basis. The reconstructed data created that way is then decoded in the same fashion as for each trial. A more powerful reconstruction function employs a threshold to determine whether each voted-on symbol is sufficiently "reliable". If not, it is marked as an erasure. The reconstructed data created by this reconstruction function is decoded according to an error-and-erasure algorithm, which increases the error-correcting power of the ECC.

6 Claims, 2 Drawing Sheets

DATA RECOVERY AFTER ERROR CORRECTION FAILURE

FIELD OF THE INVENTION

The present invention relates to the field of error correction in digital data systems.

BACKGROUND OF THE INVENTION

In digital data systems, it is a common problem for important data to become corrupted by data errors. Data stored on a data storage device, for example, is subject to errors as a result of surface defects or of imperfect tracking between the recording head and a "track" containing the data. Similarly, data that is transmitted from a sender to a receiver on a network may become corrupted by noise. While digital data systems are designed to eliminate sources of errors and to reduce their effects, nevertheless data errors still occur. It is desirable to be able to recover data despite the presence of data errors.

In order to enhance data integrity in digital data systems, such systems commonly employ error correction coding techniques. The use of such techniques enables digital data systems to recover data correctly despite the presence of errors. Using error correction coding, a data system encodes a piece of data into a codeword which typically consists of the original piece of data and some check data. The check data is generated from the original data according to an error-correcting code (ECC). The decoder for the ECC is capable of decoding the codeword to obtain the original data even if some of the data or check symbols are in error. The decoder can distinguish codewords despite errors because the codewords generated by the ECC are sufficiently different from each other. Such a decoding process is similar to a human's ability to correct spelling errors as he or she reads, because words are sufficiently different from each other that he or she "knows" which word is meant.

There are several considerations that determine the error-control strategy to be used in a system. The ECC should be as simple as possible, so that the cost and complexity of the decoder is minimized. The ECC must also have enough correction power so that data integrity is maintained in the system. For a code of given complexity, the number of errors the code can correct is approximately proportional to the number of check symbols in its codewords. High data integrity therefore implies large codewords. However, the ECC should not require an excessive amount of precious storage space or network bandwidth for the necessary check symbols.

In order to maintain high data integrity, a system would employ an ECC that can correct the maximum number of errors that may be encountered on a piece of data. However, this maximum number is typically far greater than the average number of such errors, and therefore the average codeword used in such a system wastes a substantial number of its check symbols. It is highly desirable to employ an error correction technique that obtains high data integrity while minimizing the size of the codewords employed, or, alternatively, maximizes data integrity for a given-size codeword.

SUMMARY OF THE INVENTION

The present invention enhances error-correction capability in digital data systems. The disclosed method allows recovery of data from a sequence of possibly error-corrupted instances or copies of an encoded data word that is created from the data according to an error-correction code (ECC). The sequence may be the result, for example, of transmitting the encoded data word multiple times on a data network, or of repetitively reading a storage location on a data storage device where a copy of the encoded data word has been stored. Each copy of the encoded data word, which consists of multiple symbols, is decoded according to the ECC. In the event that none of the copies is successfully decoded, the following steps are taken: (1) from the sequence of copies of the encoded data, a reconstructed encoded data word is formed according to a reconstruction function; and (2) the reconstructed encoded data word is decoded according to the ECC. The reconstruction function reduces the number of sporadic or soft errors. One method of reconstruction is majority voting on a symbol-by-symbol basis. The reconstructed encoded data word that is created by the reconstruction function tends to have fewer soft errors than each copy of the encoded data word. Because it tends to have fewer soft errors, the reconstructed encoded data word tends to have a greater chance of being decoded successfully than do the copies. The invention provides the advantage of greater data integrity in digital systems, because data may be recovered during the final decoding step despite the failure to decode each copy individually.

A powerful extension to the above-described method is also disclosed, wherein the reconstruction function compares the number of symbols in the majority to a threshold to determine whether the symbol is reliable. When the number in the majority is less than the threshold, the corresponding symbol in the reconstructed encoded data word is marked as an "erasure", or a known erroneous symbol. The reconstructed data word is then decoded with an error-and-erasure decoding algorithm. This error-and-erasure method has a large advantage over error-only decoding, because it nearly doubles the correction power of the ECC. This greater correction power can be exploited to substantially increase data integrity. Alternatively, smaller codewords can be used to achieve the same correction power as in the error-only method. The use of smaller codewords results in higher data density on a data storage device or higher useable data bandwidth on a network.

BRIEF DESCRIPTION OF THE DRAWING

Embodiments of the invention will be described with reference to the accompanying drawings, in which.

DESCRIPTION OF THE EMBODIMENTS

Figure 1:
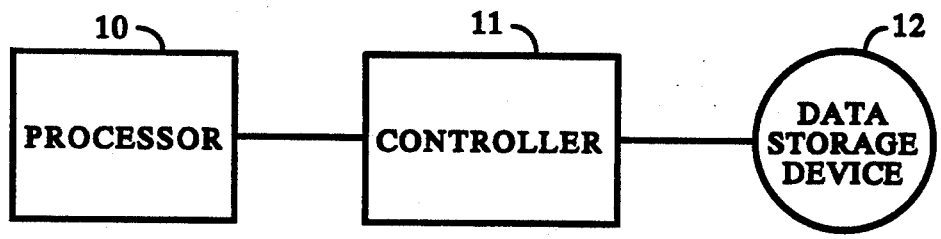
FIG. 1 is block diagram of a data processing system having a data storage device and a device controller in accordance with the invention.

A first embodiment of the invention is shown in FIG. 1, which illustrates a data processing system wherein a processor 10 is coupled to a controller 11, which is in turn coupled to a storage device 12 In such a system, the processor 10 stores data on the storage device 12 for later retrieval. The storage device 12 may be, for example, a disk drive having a magnetic or an optical storage medium.

In operation, the processor 10 issues store and read requests to the controller 11, which in turn accesses the storage device 12 to complete the processor's request. To store data, the processor 10 issues a store command to the controller 11 and also provides a sector address and a block or sector of data to be stored. Alternatively, instead of providing the data, the processor 10 may provide a memory address corresponding to the first word of the data sector stored in a memory (not shown in FIG. 1) within the processor 10, and the controller then reads the data from that memory beginning at the memory address provided by the processor 10. In either case, the controller 11 then writes the data sector at the location on the storage device 12 that corresponds to the sector address. To read the data, the processor 10 issues a read command and address to the controller 11, which then accesses the location on the storage device 12 that corresponds to the read address, and returns the requested data sector to the processor 10. The size of the data sector is a design parameter in the data processing system. For example, a sector may contain 512 bytes of user data plus some bytes for overhead information.

Data being transferred to or from the storage device 12 is subject to errors for many reasons. For example, there may be defects at locations on the storage medium used within the storage device 12 that prevent the storage device 12 from reliably storing data at those locations. These defects typically induce "hard" errors, which are errors that persist on every re-read of the defective location. There are also "soft" errors, which tend not to persist. Soft errors have many possible sources, including normal tracking inaccuracies between the recording/playback head and the track of data on the surface of the storage medium.

To reliably store data in spite of such errors, the controller 11 employs an error correction scheme when storing and retrieving data from the storage device 12. The controller 11 encodes the data sector provided by the processor 10 in accordance with an error-correction code (ECC), and stores the resulting encoded data sector on the storage device 12. The error correction code has the property that the original data sector can be recovered from the encoded data sector even if the encoded data sector contains some errors. When the processor 10 issues a read command, the controller 11 reads the encoded data sector from the storage device 12 and decodes it in accordance with the ECC to obtain the original data sector. It then returns the data sector to the processor 10.

The type of ECC employed by the data processing system of FIG. 1 is determined by several factors, most of which are unrelated to the present invention. Among these factors are the amount of storage area required for the encoded data, the code's error-correction power, and the complexity of the corresponding decoder. The present invention can be practiced with any type of block code for which suitable decoders can be made. A commonly-used type of code in data storage systems is the class of Reed-Solomon codes, which are special forms of BCH codes. Although the embodiment of FIG. 1 will therefore be described with reference to Reed-Solomon codes, it is to be understood that the principles of the invention are not so limited.

Each Reed-Solomon codeword consists of data symbols and redundant symbols. The symbol size, which is the number of bits per symbol, is a design parameter. The maximum number of symbols in a cyclic Reed-Solomon codeword is equal to $2^{(symbol\ size)} - 1$. Of course, the codeword must have sufficient symbols to encode both the data sector and whatever redundancy information the code requires. For a data sector size of 512 eight-bit bytes, a symbol size of 10 bits works well. A ten-bit symbol enables codes having up to 1023 symbols to be used. The data sector, which contains 4096 bits, is encoded into 410 ten-bit data symbols. Thus there may be up to 613 redundant symbols added by the code. There are many Reed-Solomon codes of varying error-correcting power which may be used. The techniques for selecting a particular code are known in the error correction field. For example, a method of generating a Reed-Solomon code is described in Sec. 2.3.1 of *Error Correction Coding for Digital Communications* by G. Clark and J. Cain, Plenum Press, New York (1981) p. 86–87.

When the controller 11 reads and decodes the data sector from the storage device 12, all erroneous symbols in the data sector are corrected as long as the number of symbol errors does not exceed an error limit. This error limit is determined by the type of ECC used by the controller 11. For Reed-Solomon codes, the error limit is $\frac{1}{2}$(number of redundant symbols $-1$). Thus, for example, a code that adds 67 redundant symbols to the data symbols to form a codeword can correct up to 33 errors. In the process of decoding, the controller 11 determines whether the error limit has been exceeded. If the error limit has been exceeded, then the decoded data contains errors. In most instances, erroneous data cannot be given to the processor 10. If the error limit has not been exceeded, then the original data sector has been decoded from the encoded read result data sector correctly, and can be passed on to the processor 10.

The controller 11 of FIG. 1 performs multiple read trials until either a trial yields a read result data sector having fewer errors than the code's error limit, or the number of trials has reached a trial limit. The trial limit is a design parameter in the system. A high trial limit results in more successful data recovery, while increasing the worst-case data access time; a lower trial limit of course does the opposite. The trial limit might be set to 2 in a relatively error-free system; it would be higher in a more error-prone system.

The trial method discussed above is effective when at least some of the errors in the data sector are soft errors, so that the number of erroneous symbols in at least one of the trials will be less than the error limit. If the soft error rate is low, one of the trials is likely to be successful by itself in obtaining the original data. However, when the soft error rate is higher, or when the combination of hard and soft errors pushes the total number of errors over the error limit, the likelihood of successful decoding in a series of trials diminishes.

Figure 2:
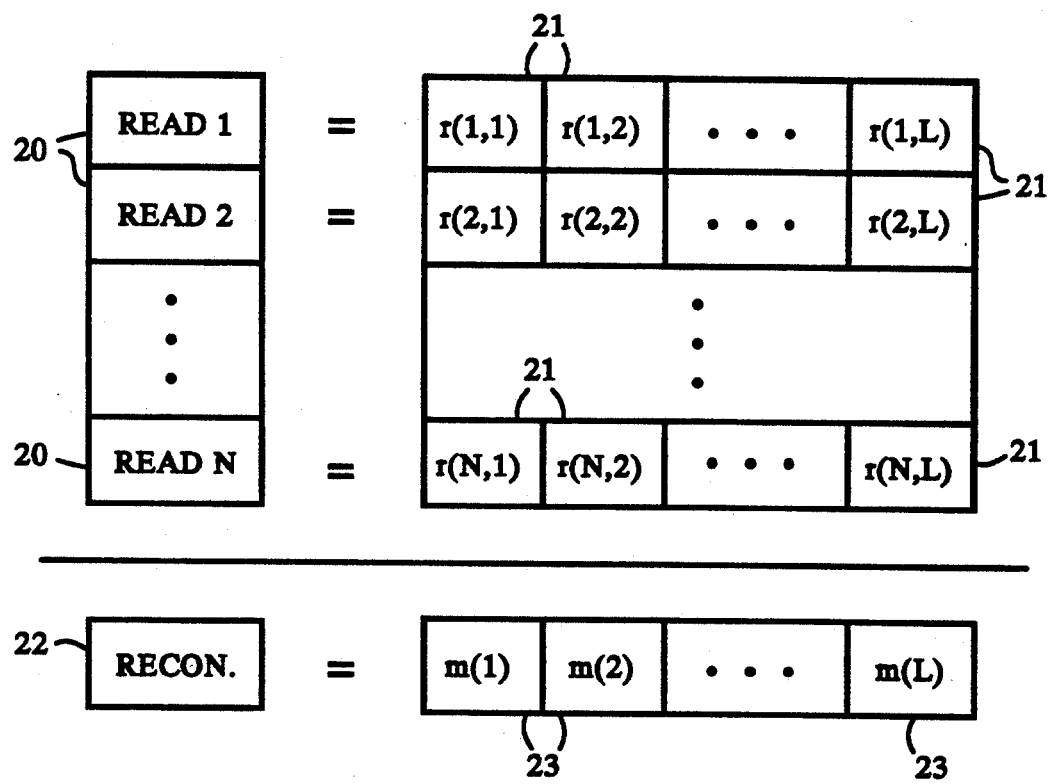
FIG. 2 shows a conceptual matrix arrangement of a sequence of symbols obtained from several trials of reading an encoded data sector from the data storage device of FIG. 1, and the reconstructed encoded data sector comprising symbols obtained by majority voting.

In order to obtain the original data sector despite the failure of several trials, the controller 11 implements additional functions illustrated in FIG. 2. The result of each trial is an encoded read result data sector 20, each of which may be different due to errors. Each read result data sector consists of L read result symbols 21, where L is the total number of symbols in a codeword. The read result symbols 21 from the sequence of encoded read result data sectors 20 are conceptually arranged in a matrix as shown in FIG. 2. Each row of the matrix contains the L read result symbols 21 from a corresponding read result data sector 20. The rows of the matrix are numbered from 1 to N, where N is the trial limit. The read result symbols 21 are identified in FIG. 2 by the notation r(n,1), where "n" indicates both the trial number and the row number, and "1" indicates the symbol number within each row. It should be noted that the read result symbols 21 in a given column are the results of reading a single symbol location on the storage device 12 of FIG. 1 N times.

From the matrix of read result symbols 21 shown in FIG. 2, the controller 11 creates a reconstructed encoded data sector 22 according to a reconstruction function. The reconstructed encoded data sector 22 has L reconstructed symbols 23, each of which is formed by majority voting within the corresponding column of read result symbols 21, as shown in FIG. 2. The value m(1) of each reconstructed symbol 23 is given by:

$$m(1) = \text{Majority }[r(1,1), r(2,1), \ldots, r(N,1)]$$

where "Majority" means the symbol value of the highest number of matching symbols in the set of read result symbols 21 in the column. If two or more symbols are tied for the majority, then one of them is picked arbitrarily.

By employing majority voting to create the reconstructed encoded data sector 22, the controller further minimizes the effect of soft errors. Many of the soft errors are corrected in the process of determining the majority in each column. Therefore the reconstructed encoded data sector 22 tends to have fewer soft errors than a given read result data sector 20.

After the reconstructed data sector 22 is thus formed, the controller 11 of FIG. 1 decodes the reconstructed data sector 22 in the same fashion as for each read result data sector 20. Since many, if not all, soft errors have been eliminated, this decoding is much more likely to succeed than the decoding of a given read result data sector 20.

It should be noted that the matrix formed from the sequence of read result data sectors 20 in FIG. 2 is conceptual. The controller 11 may have a memory to store the read result symbols 21, and may actually organize that memory as a 2-dimensional array to store the read result symbols 21 as a matrix. However, the fundamental process being performed by the reconstruction function is the creation of the reconstructed encoded data sector 22 from the sequence of read result data sectors 20; this process is not dependent on a particular representation or arrangement of the read result data sectors 20 or the read result symbols 21.

It should also be noted that the time required to create the reconstructed encoded data sector 22 is proportional to the number of symbols L in the codewords. This is because a majority must be determined for each column, and the number of columns matches the number of reconstructed symbols 23. Since the number of symbols L is a function of the symbol size, as described above, the choice of symbol size is thus a factor in the performance of the reconstruction function. The number of symbols L, and therefore the time required to perform the reconstruction function, decreases as the symbol size increases.

It is also possible to perform majority voting on a bit-by-bit basis, regardless of symbol size, to create the reconstructed encoded data sector 23. While such fine-grain reconstruction is more time-consuming than symbol-by-symbol reconstruction, it has potentially more error-correcting power if particular bits are error-prone.

For the majority voting of FIG. 2 to yield useful results, the trial limit N must be at least 3. Larger values of N tend to increase the access time of the storage device 12, but also increase the error-correction ability of the data recovery scheme of FIG. 2. Additionally, an odd value of N increases the chances of obtaining a majority if N is small.

In the data recovery scheme of FIG. 2, it is not necessary that decoding be attempted on each trial. In some systems, it may be practical to decode only the first trial. If the first trial is successful, then no resort to the data recovery scheme of FIG. 2 is taken. If the first trial is unsuccessful, the controller 11 may merely read the encoded data sector N−1 additional times, without decoding it, in order to form the matrix, so that it can proceed with the creation and decoding of the reconstructed encoded data sector. However, most systems of the type shown in FIG. 1 decode the read result data sector 20 during each trial, because there is no other work for the decoder to do during a trial.

Although the data recovery method described with reference to FIG. 2 improves on prior methods, its effectiveness may be limited by very "noisy" or unreliable symbol locations on the storage device 12. As mentioned, when multiple symbols in a column are tied for the majority, then one of those symbols is chosen arbitrarily as the majority symbol for that column. If a symbol location on the storage device 12 is sufficiently unreliable, then it is possible that many read result symbols 21 in the corresponding column of the matrix in FIG. 2 are different. In this case, it is likely that choosing a symbol arbitrarily results in choosing an erroneous symbol for inclusion in the reconstructed data sector 20, thus rendering it less likely to be successfully decoded.

This problem is overcome by a powerful extension to the data recovery method described above. Before creating the reconstructed data sector 20, a minimum majority threshold T is chosen. A reconstructed symbol 23 is only set equal to the majority symbols in the corresponding column if the number of that majority is at least T. In columns not having such a minimum majority, the corresponding reconstructed symbol 23 is marked as an "erasure". Therefore the reconstructed data sector 22 consists of a mixture of majority symbols and erasures.

The reconstructed data sector 22 containing erasures is then decoded according to an error-and-erasure decoding algorithm for the particular code being employed. Such algorithms are generally able to correct a greater number of errors plus erasures than errors alone. One measure of the power of error-correction codes is their "minimum distance". The minimum distance can be thought of as the minimum number of differing symbols between any two valid codewords. For a code having a minimum distance of D, a reconstructed data sector 22 is successfully decoded if the following condition is met:

$$D \leq 1 + (\text{\# of erasures}) + 2(\text{\# of errors}).$$

Therefore, such a code tolerates a maximum of (D−1)/2 errors in the absence of erasures, but tolerates twice as many erasures in the absence of other errors. Thus an error-and-erasure code is more tolerant than an error-only code of soft errors that are not easily correctable by majority voting. In order to use an error-and-erasure decoding algorithm, of course, a code must be chosen for which such an algorithm exists. The Reed-Solomon codes are such codes. An example of an error-and-erasure decoding algorithm for the Reed-Solomon codes can be found in Sec. 5.6 (p. 214–218) of the above-cited *Error Correction Coding for Digital Communications*.

There are different ways of selecting the value of the majority threshold T. T must be in the range from 2 to N, the trial limit. Higher values of T correspond to higher erasure rates and lower error rates; conversely, lower values of T correspond to lower erasure rates and higher error rates. One approach to selecting the value of T is to fix it somewhere in the range that gives optimal performance, i.e., gives the highest probability of successful decoding. This value may be determined empirically, for example, during testing of a particular storage device 12.

Figure 3:
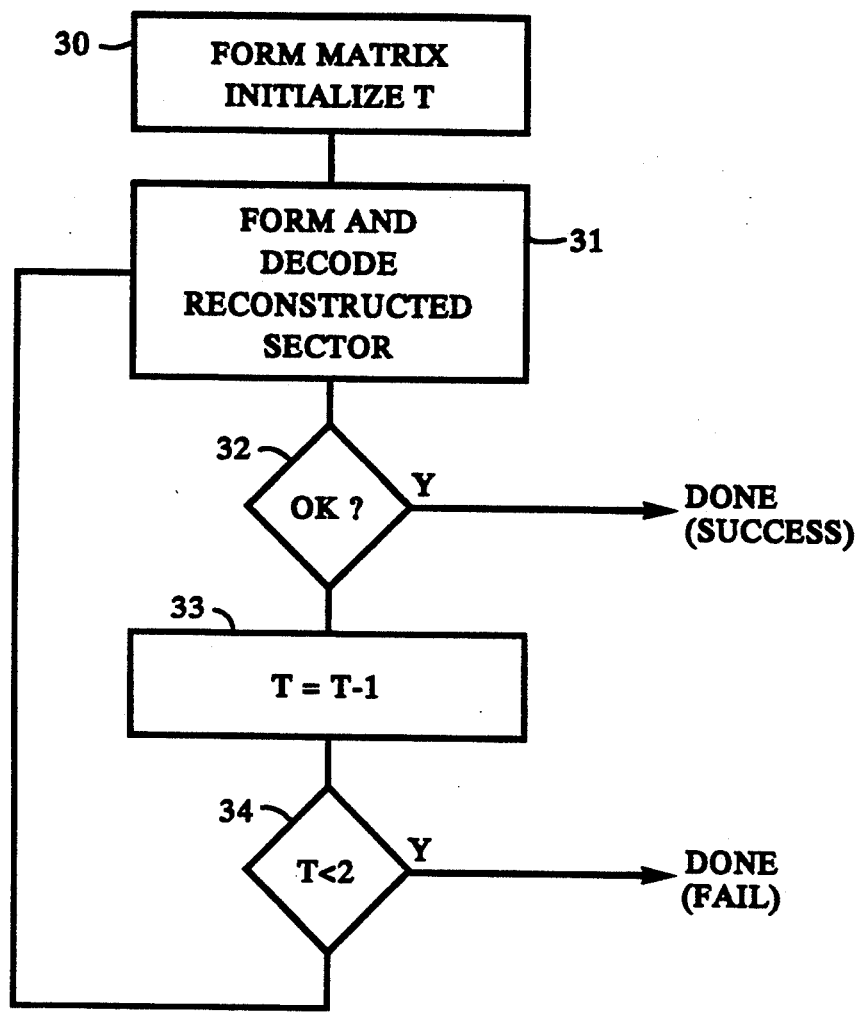
FIG. 3 shows a method of repeating the formation and decoding of a reconstructed encoded data sector employing a variable threshold for erasing unreliable symbols.

T may also be made a variable, in order to maximize the probability of successful decoding on every read transaction. The value of T can be modified during the data recovery process as shown in FIG. 3. In step 30, the matrix of FIG. 2 is formed. Also, T is set to an initial value. The preferred initial value is a number less than N but close to N, for example N−1. In step 31 the reconstructed data sector 22 is created and decoded. The reconstruction function employed in step 31 is similar to the majority voting described with reference to FIG. 2, except that it also uses T as described above to mark as "erasures" those of the reconstructed symbols 23 whose corresponding columns do not have at least T symbols in the majority. After the reconstructed data sector 22 is thus created, it is decoded according to an error-and-erasure decoding algorithm.

In step 32, the results of the decoding in step 31 are checked. If decoding was successful, then it is complete. If not, T is decremented by some value (typically 1) in step 33. Step 34 tests whether T has gone below the lower limit of its range. If so, decoding has failed. If not, the entire process is repeated from step 31 using the new value of T.

The algorithm shown in FIG. 3 has the advantage that the "optimal" value of T, if one exists, is used at some point in the decoding process if necessary. While the repetition tends to increase the time it takes to decode, this algorithm ensures the highest chance for successful decoding.

Figure 4:
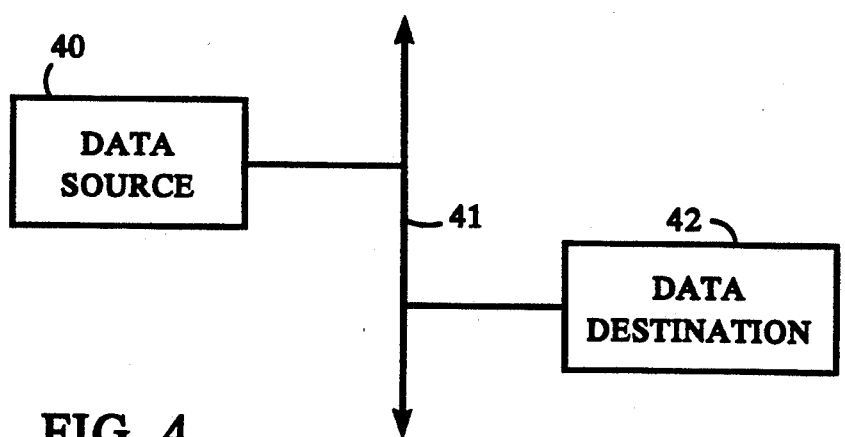
FIG. 4 is a block diagram of a data communications system according to an alternative embodiment of the invention.

While the data recovery scheme illustrated in FIGS. 2 and 3 has been described in the context of the data processing system of FIG. 1, it is equally applicable to many other types of data systems employing error correction techniques. In particular, an alternative embodiment of the invention is shown in FIG. 4, which shows a data communications network. In FIG. 4, a data source 40 on the network, such as a computer, sends a packet of data over the network bus 41 to a data destination 42, which may be another computer or some other network device, such as a printer. In the embodiment of FIG. 4, each transmission of a packet of data is accompanied by redundant symbols, just like the data stored on the storage device 12 of FIG. 1. At the data destination 42, the data and redundant symbols are decoded according to the error correction code being employed in the system. If the decoding is successful, the data destination 42 accepts the data and sends an "acknowledge" packet back to the data source 40. If the data source 40 does not receive an "acknowledge" packet within a predetermined time period, it understands that the destination 42 did not successfully receive the intended data. The data source 40 then repeats the transmitting and waiting steps until either it receives an "acknowledge" packet or the number of repetitions exceeds a trial limit. This process creates a sequence of encoded data packets, just as the process of repetitively reading the storage device 12 of FIG. 1 creates a sequence of encoded data sectors. Each transmission of the data packet therefore corresponds to one of the trials described in the embodiment of FIGS. 1 through 3.

The data destination 42 implements the data recovery scheme shown in FIGS. 2 and 3 on the series of data packets that it receives over the network bus 41 from the data source 40. If the data source 40 does not receive an "acknowledge" packet after the last trial, it knows that the data did not arrive successfully. However, if the data destination 42 successfully decodes the reconstructed data "packet" (rather than "sector") after the last trial, it then sends the "acknowledge" packet, so that the data source 40 knows that the data arrived successfully. In this fashion, the system of FIG. 4 implements a data recovery scheme that operates according to the same principles as the scheme implemented in the data processing system of FIG. 1.

While the invention has been described with reference to particular embodiments thereof, the scope of its application and features extends to other embodiments and is limited only by the claims that follow.

What is claimed is:

1. A method of storing and retrieving data in a data processing system, comprising the steps of:
producing from said data according to an error-correction code an encoded data word consisting of a first number of encoded symbols;
writing said encoded data word to a storage location on a data storage device;
reading said storage location to obtain a read result data word consisting of result symbols corresponding to said encoded symbols;
decoding said read result data word according to said error-correction code to produce decoding result data and to determine whether said decoding result data matches said data;
repeating said reading and decoding steps at most a second number of times until said decoding result data matches said data, thereby producing sequences of result symbols corresponding to said encoded symbols;
producing from said sequences of result symbols a reconstructed data word consisting of reconstructed symbols corresponding to said sequences of result symbols, wherein each of said reconstructed symbols equals those of said result symbols forming a majority in the corresponding one of said sequences of result symbols if the number of said majority is at least a threshold number, and otherwise equals an erasure; and
decoding said reconstructed data word according to an error-and-erasure decoding algorithm for said error-correction code.

2. A method according to claim 1, wherein said error-correction code is a BCH code.

3. A method according to claim 2, wherein said BCH code is a Reed-Solomon code.

4. A method according to claim 1, wherein said second number is odd and greater than 2.

5. A method according to claim 1, wherein said threshold number is a fixed number.

6. A method according to claim 1, wherein said step of decoding said reconstructed data produces final decoding result data, and wherein said threshold number is a variable number between 2 and said second number, and further comprising the step of repeating said steps of producing and decoding said reconstructed data word for every possible value of said threshold number until said final decoding result data matches said data in said step of decoding said reconstructed data word.

* * * * *